US012568573B2

(12) United States Patent
Ullrich et al.

(10) Patent No.: US 12,568,573 B2
(45) Date of Patent: Mar. 3, 2026

(54) CIRCUIT ARRANGEMENT, PRINTED CIRCUIT BOARD ARRANGEMENT, ELECTRIC DRIVE AND MOTOR VEHICLE

(71) Applicant: ZF Friedrichshafen AG, Friedrichshafen (DE)

(72) Inventors: Florian Ullrich, Gerolzhofen (DE); Robin Michelberger, Schweinfurt (DE); Joao Bonifacio, Meckenbeuren (DE); Alexander Büttner, Sulzthal (DE); Michael Engel, Markdorf (DE)

(73) Assignee: ZF Friedrichshafen AG, Friedrichshafen (DE)

( * ) Notice: Subject to any disclaimer, the term of this patent is extended or adjusted under 35 U.S.C. 154(b) by 97 days.

(21) Appl. No.: 18/456,081

(22) Filed: Aug. 25, 2023

(65) Prior Publication Data

US 2024/0074040 A1     Feb. 29, 2024

(30) Foreign Application Priority Data

Aug. 31, 2022    (DE) ......................... 102022209005.5

(51) Int. Cl.
H05K 1/02            (2006.01)
H05K 5/00            (2025.01)

(52) U.S. Cl.
CPC ......... H05K 1/0257 (2013.01); H05K 1/0231 (2013.01); H05K 1/0234 (2013.01); H05K 1/0268 (2013.01); H05K 5/0026 (2013.01)

(58) Field of Classification Search
CPC .. H05K 1/0257; H05K 1/0231; H05K 1/0234; H05K 1/0268; H05K 5/0026; H02M 7/48; H02M 1/32; H02H 7/16; H02H 3/027; H02H 9/04
USPC .......................................... 361/118
See application file for complete search history.

(56) References Cited

U.S. PATENT DOCUMENTS

| | | | | |
|---|---|---|---|---|
| 4,891,728 | A | * | 1/1990 | Preis .................... H03K 17/163 323/276 |
| 9,973,134 | B1 | * | 5/2018 | Namuduri ............... B60L 58/15 |
| 9,991,783 | B2 | * | 6/2018 | Voegele .................. H02M 1/32 |
| 2015/0130273 | A1 | * | 5/2015 | Govindaraj ............. B60L 50/10 324/548 |
| 2017/0118838 | A1 | * | 4/2017 | Williams ............... H05K 3/361 |

FOREIGN PATENT DOCUMENTS

DE        102016004583 A1 * 10/2017 ............. H02H 9/042
DE        10 2018 104 353 A1    9/2018

OTHER PUBLICATIONS

Office Action in German Application No. DE 10 2022 209 005.5, dated Aug. 19, 2023 (10 pages).

* cited by examiner

*Primary Examiner* — Sreeya Sreevatsa
(74) *Attorney, Agent, or Firm* — Crowell & Moring LLP

(57) ABSTRACT

A circuit configuration includes a voltage surge protector that is connected in parallel to the link capacitor to protect the link capacitor from voltage overloads. A printed circuit board assembly, an electric axle drive, and a motor vehicle are also disclosed.

20 Claims, 2 Drawing Sheets

CIRCUIT ARRANGEMENT, PRINTED CIRCUIT BOARD ARRANGEMENT, ELECTRIC DRIVE AND MOTOR VEHICLE

CROSS-REFERENCE TO RELATED APPLICATION

This application claims priority to German Application No. DE 10 2022 209 005.5, filed on Aug. 31, 2022, the entirety of which is hereby fully incorporated by reference herein.

FIELD

The present invention relates to a circuit configuration that comprises a link capacitor and an inverter circuit. The invention also relates to a printed circuit board assembly, an electric drive, and a motor vehicle.

BACKGROUND AND SUMMARY

An inverter is used to convert direct current into alternating current for an electric machine. This involves a direct current input voltage that is stabilized by a link capacitor. The inverter then outputs an alternating current to the different phases in the electric machine. The inverter comprises power semiconductors with which the alternating current is generated, which can be switched from an off (non-conductive) state to an on (conductive) state with a driver circuit.

Electric machines such as asynchronous motors (ASMs) and separately excited synchronous machines (SSMs) are used in the traction drives in electric or hybrid vehicles. If anything happens that could compromise safety, such as an abrupt load shedding when functioning as a generator, the electric machine must be shut down safely. In this state, electricity is normally no longer supplied to the electric machine. With asynchronous motors and separately excited synchronous machines, the so-called inverter lock can be used. All of the power semiconductor switches in the inverter are switched to off in the inverter lock, thus blocking any electrical current to the electric machine. Because the circuit breakers are dedicated to free-wheeling diodes, the magnetic energy stored in the electric machine when the switches are turned off can flow back into the link circuit in the inverter, because the rotor magnetization is not maintained at this point, resulting in a voltage surge in the link capacitor.

If the link capacitor is large enough, these voltage surges remain below a critical threshold. There is a current tendency to try to reduce the size of link capacitors in order to reduce costs and installation space. This makes it necessary to identify and limit voltage surges in the link capacitors to prevent damaging or destroying them.

An object of the invention is to therefore create a circuit configuration, printed circuit board assembly, electric drive, and a motor vehicle that solve this problem.

The problem is solved with a circuit configuration like that specified above with a voltage surge protector connected in parallel to the link capacitor to protect the link capacitor from voltage surges.

The circuit configuration contains a link capacitor that is interconnected between two direct current contacts DC+ and DC− to stabilize the direct current. The link capacitor is preferably a condenser. The direct current is preferably supplied by a battery. The direct current is supplied to the circuit configuration at an inverter circuit. The inverter circuit is preferably formed by a B6 bridge circuit connected to the direct current contacts DC+ and DC−. The voltage surge protector is connected in parallel to the link capacitor. The voltage surge protector is therefore also connected to the DC+ and DC− contacts. The voltage surge protector is also preferably connected in parallel to the inverter circuit at the input side thereof. Electrical feedback from the inverter circuit in particular can result in a voltage surge at the link capacitor. In this case, a voltage surge means that a specific reference voltage is exceeded. To reduce or limit the voltage surge, electricity, e.g. from the inverter circuit, must be drained. The voltage surge protector advantageously enables current to flow between the DC+ and DC− contacts, such that electricity can be drained. This results in a voltage drop, because the flow of electricity from the inverter is limited.

The voltage surge protector preferably comprises a circuit breaker and a resistor, and deflects current through the resistor and the circuit breaker to reduce the voltage at the link capacitor. The circuit breaker and resistor are preferably connected in series. When the circuit breaker is open, no electricity flows through the voltage surge protector, because the circuit breaker then interrupts the flow of electricity. When the circuit breaker is closed such that it conducts electricity, an electrical current, restricted by the size of the resistor, can flow through the voltage surge protector. The electricity flowing through the resistor is converted to heat and discharged from the circuit configuration. With a smaller resistor, the amount of electricity flowing through the voltage surge protector is greater, such that the voltage at the link capacitor falls more quickly below a critical level.

The voltage surge protector preferably comprises a comparator circuit with which the voltage in the link capacitor is compared with a reference voltage, and when this voltage exceeds the reference voltage, the circuit breaker is switched on. A comparator circuit can comprise an operational amplifier with two voltage inputs. A reference voltage is connected to one of the inputs. A microcontroller supplies this reference voltage. The link voltage from the link capacitor is connected to the second input. This voltage can also be scaled to the link voltage, such that it is not necessary to work with high voltages. The operational amplifier is also connected to a supply voltage. If the link voltage is lower than the reference voltage, no voltage, corresponding to the DC− potential, is output from the operational amplifier. If the link voltage is higher than the reference voltage, the operational amplifier outputs the supply voltage, which is higher than the DC− potential. The supply voltage that is output closes the circuit breaker, such that it conducts electricity, thus activating the voltage surge protector.

In one embodiment of the invention, the voltage surge protector comprises a timer that opens the circuit breaker with a timer switch. The timer generates a timer signal that can have one of two values. There is a microcontroller that controls the timer. The timer signal is sent to a timer switch, which is switched off when the signal has the first of the two values, and switched on when the signal has the second of the two values. When the timer switch is on, the circuit breaker is open, regardless of the link voltage. This is because the timer switch is between the output for the comparator circuit and the DC− contact. The voltage drop at the timer switch is used to control the circuit breaker, which is nearly zero when the timer switch is on. The timer signal can be used to limit the time in which the circuit breaker is closed, thus allowing electricity to flow through the voltage surge protector in cycles.

The circuit breaker and timer switch are advantageously formed by transistors, and the timer switch is located between the gate contact and the source contact in the circuit breaker. Transistors can efficiently switch on and off, and can be switched on and off by a voltage between the source and gate contacts. These transistors are preferably MOSFETs or IGBTs. The transistor functioning as a circuit breaker is large enough to accommodate the current flowing through the voltage surge protector. The source contacts on the circuit breaker and timer switch are advantageously connected to the DC− potential. The drain contact on the circuit breaker is preferably connected to an upstream resistor with the DC+ potential. The drain contact in the timer switch is connected to the gate contact on the circuit breaker. This results in a short circuit at the gate and source contacts on the circuit breaker when the timer switch is on. This means that when the timer switch is on, the circuit breaker is open.

In one embodiment of the invention, a high voltage diode is located on the gate contact for the circuit breaker, with which a high voltage at the gate contact on the circuit breaker is separated from the rest of the voltage surge protector. Because there is a high voltage between the drain and source contacts on the circuit breaker, this high voltage can also be at the gate contact on the circuit breaker in the event of a malfunction. There is a high voltage diode that prevents the high voltage from getting to the rest of the voltage surge protection, e.g. the comparator circuit, in this case. The high voltage diode is placed such that a high voltage from the circuit breaker is blocked. A control voltage can flow through the high voltage diode in the other direction, toward the gate contact on the circuit breaker.

The circuit breaker and/or the resistor are preferably redundant. To prevent a short circuit between the DC− and DC+ contacts if the circuit breaker and/or resistor malfunction, these components can a redundant configuration. This means that there is a second resistor and second circuit breaker, which are connected in series thereto. The resistors are preferably large enough that they can replace the single resistor. The two resistors are placed in particular between the DC+ contact and the first circuit breaker. The second circuit breaker is preferably between the first circuit breaker and the DC− contact. The second circuit breaker is connected to the comparator circuit and the timer in the same manner as the first circuit breaker. The gate contact on the second circuit breaker also contains a high voltage diode.

There is a voltage pickup in one embodiment of the invention, with which the output voltage from the comparator circuit is determined. The voltage drop is then determined in a shunt resistor and/or the timer switch. The measurement value signal is connected with a potential separator to a microcontroller. This makes it possible to find out when the voltage surge protector has been triggered. This information is also useful for other circuit breakers. The measurement value signal is also preferably sent to the inverter circuit. The inverter circuit can be blocked when the voltage surge protector is triggered, if this is not already the case. It is also possible to disconnect a battery system from the circuit configuration.

In one embodiment, the voltage pickup determines the voltage at the timer switch. The measurement value signal is connected to a microcontroller in particular with a potential separator. The functioning of the timer switch can be monitored indirectly with the voltage drop therein. In particular in conjunction with the output voltage from the comparator circuit, it is possible to determine if the timer switch is on or off. Furthermore, when the voltage surge protector is not malfunctioning, it is possible to determine if the circuit breaker is open or closed.

In one embodiment, the voltage pickup determines the current flowing through the circuit breaker. With a conventional shunt resistor, a voltage pickup can determine the current flowing through the shunt resistor. The shunt resistor is connected in series with the circuit breaker for this, such that the current through the circuit breaker or the voltage surge protector is determined indirectly. The measurement value signal is connected to a microcontroller in particular through a potential separator. This makes it possible to monitor the functioning of the voltage surge protector. By way of example, in addition to detecting a malfunction, it is also possible to determine whether the current flowing through the voltage surge protector exceeds a limit value.

There is preferably a test circuit for checking the voltage surge protector for malfunctions. The test circuit can provide the reference voltage to the time, in particular for detecting latent errors in conjunction with a microcontroller, for example. A test can be carried out when starting the system, for example.

In one embodiment of the invention, the voltage surge protector can drain the link capacitor. To obtain a safe state for the circuit configuration, the link capacitor must be drained of any electricity stored therein. This can be achieved by setting the reference voltage to zero. This automatically deactivates the inverter, separating the circuit configuration from the power source. The link capacitor is then drained entirely by the resistor. Because of the low resistances necessary for the functioning of the voltage surge protector, the circuit breaker is preferably opened and closed by the timer at a high frequency in order to prevent overloading the voltage surge protector due to excessively quick draining.

The invention also comprises a printed circuit board assembly, in particular an inverter with a circuit configuration like that described above.

The invention also comprises an electric axle drive for a motor vehicle that has at least one electric machine and a printed circuit board assembly like that describe above.

The invention also comprises a motor vehicle that contains an electric axle drive and/or the printed circuit board assembly described above.

Advantageous embodiments and further features of the invention shall be explained in greater detail in the context of exemplary embodiments and in reference to the drawings.

DETAILED DESCRIPTION

Figure 1:
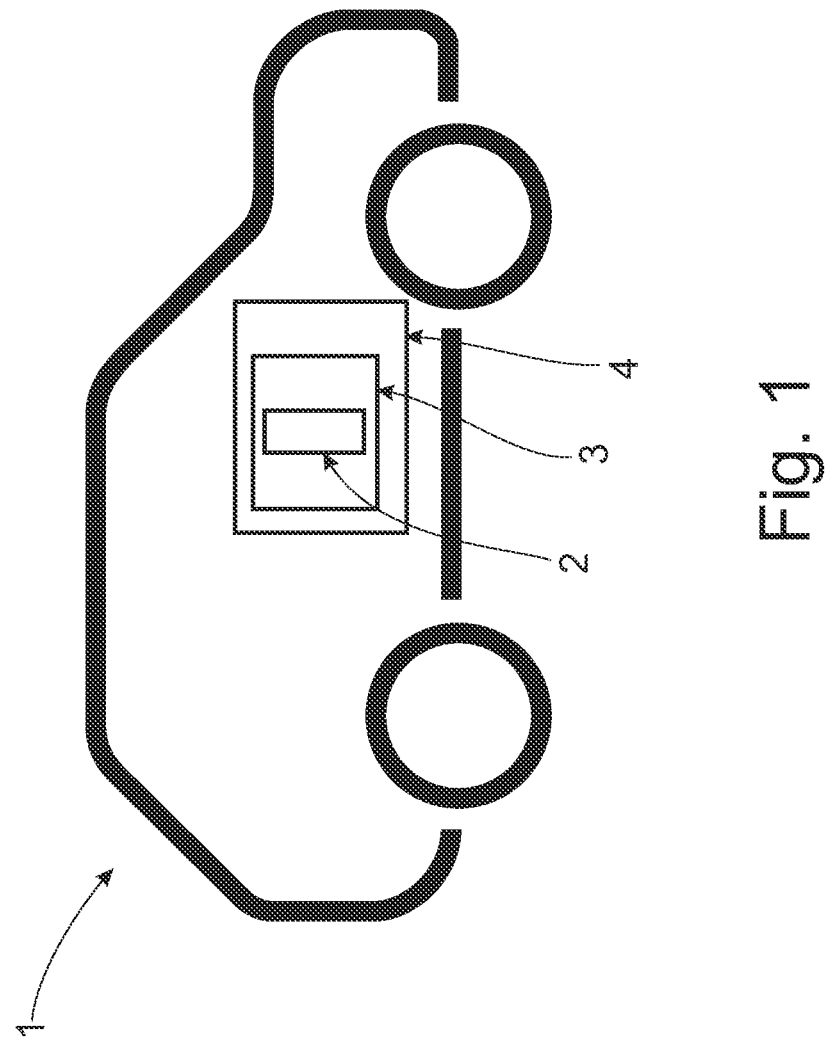
FIG. 1 shows a motor vehicle.

FIG. 1 shows a motor vehicle 1 that has a circuit configuration 2 as part of a printed circuit board assembly 3, which in turn is part of an electric axle drive 4.

Figure 2:
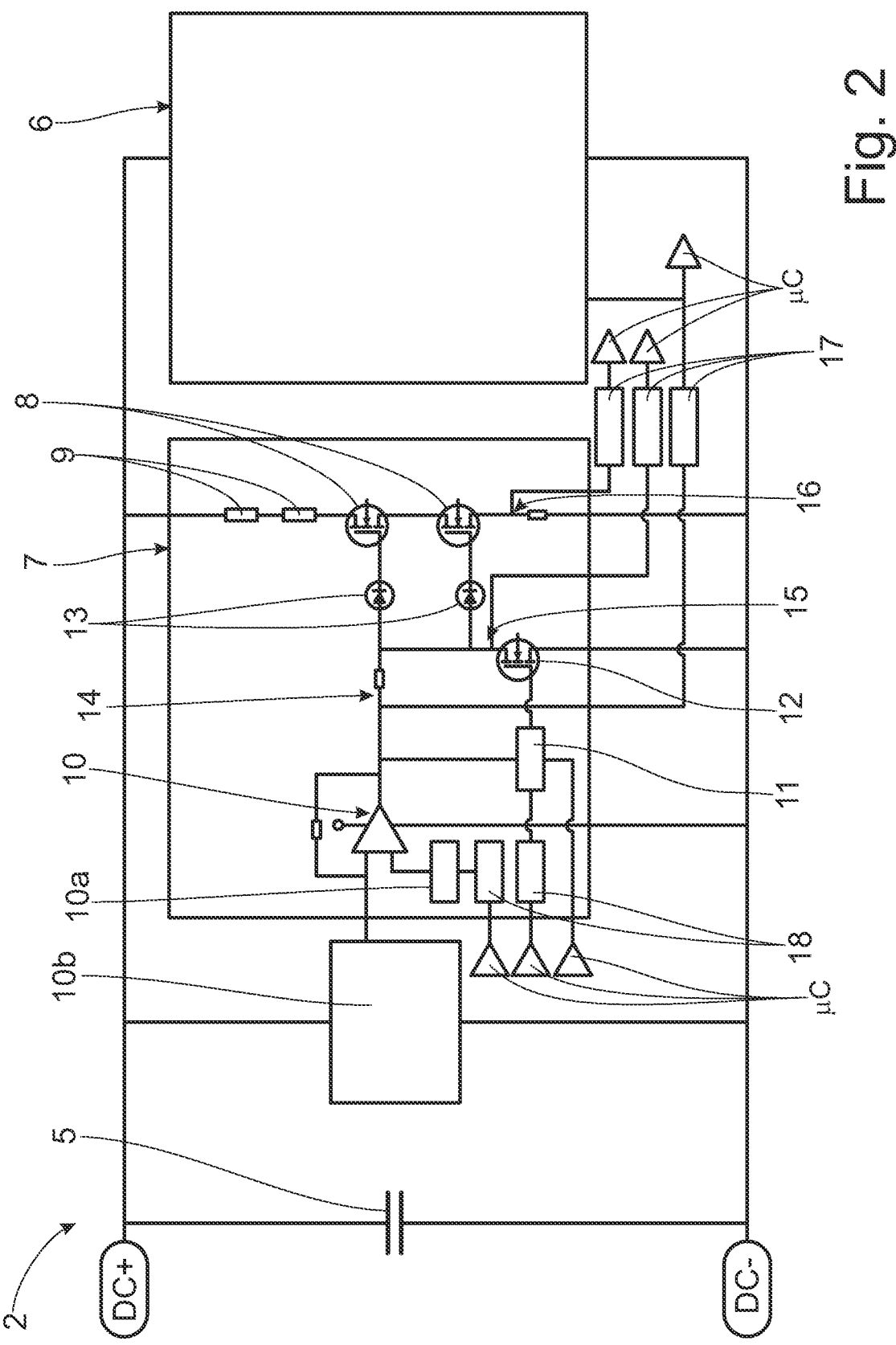
FIG. 2 shows a schematic illustration of a circuit configuration.

FIG. 2 shows a schematic design of the circuit configuration 2 in the form of a circuit diagram. The circuit configuration 2 comprises a link capacitor 5 in the form of a condenser. There are also an inverter circuit 6 and a voltage surge protector 7, which are connected in parallel to the link capacitor 5 and the direct current contacts DC+ and DC−. The circuit configuration can be connected to a direct current source, such as a battery system, with the direct current contacts DC+ and DC−. The inverter circuit 6 comprises a bridge circuit, and a driver circuit for controlling the bridge circuit, which are not shown explicitly. The voltage surge protector 7 comprises two circuit breakers 8 and two resistors 9, which are connected in series between the direct current contacts DC+ and DC−. The circuit breakers 8 and resistors 9 are doubled for purposes of redundancy. The circuit breakers 8 are formed by transistors.

The transistors forming the circuit breakers 8 are controlled by a comparator circuit 10. The output signal from the comparator circuit 10 is connected to the gate contacts in the transistors forming the circuit breakers 8. The comparator is connected at its input to a reference voltage 10a and the link voltage 10b. The link voltage 10b is determined by a voltage measurement at the link capacitor 5. The absolute voltage of the link voltage 10b does not need to be sent to the comparator circuit 10, and instead, this can be a value reduced by a scaling factor. The reference voltage is provided by a microcontroller μC in which this scaling factor is accounted for. If the link voltage 10b is higher than the reference voltage 10a, the comparator circuit outputs its supply voltage, which can close the circuit breaker 8.

The voltage surge protector also contains a timer 11, which can also be controlled by a microcontroller μC. The timer 11 generates a timer signal that is sent to a timer switch 12. The timer 11 is also connected to the output on the comparator circuit 10. The timer receives information therefrom regarding the intended switching state of the circuit breaker 8. By way of example, the timer 11 is activated when the comparator circuit 10 outputs its supply voltage. The timer switch 12 is formed by a transistor, the gate contact of which is connected to the timer 11. The timer switch 12 is between the gate contacts on the circuit breaker 8 and the DC− potential. This allows the timer switch 12 to open the circuit breaker 8 by switching the gate voltage at the circuit breaker 8 to the DC− potential by switching on the timer switch 12. The timer 11 can limit the time in which the circuit breakers 8 are closed in this manner. The timer 11 can define a frequency at which the circuit breakers 8 are closed.

The gate contacts in the circuit breakers 8 are also upstream of high voltage diodes 13, to block a disruptive high voltage at the gate contact and therefore protect the rest of the voltage surge protector 7.

There is a voltage pickup 14 for obtaining information regarding the output voltage from the comparator circuit 10, which taps into the voltages through a shunt resistor and the timer switch 12, and sends them as measurement signals to a microcontroller μC via a potential separator 17 for further processing. This output signal from the comparator circuit 10 can also be sent at the same time directly to the inverter circuit 6, in order to switch off the inverter, for example. Another voltage pickup 15 can determine the voltage through the timer switch 12. This measurement signal is also sent to a microcontroller μC by a potential separator 17, with which, preferably in combination with other measurement signals, information regarding the switching state of the timer switch 12 is obtained. Another voltage pickup 16 is between the circuit breakers 8 and the DC-potential, with which a voltage drop is measured in a shunt resistor. This voltage signal is also sent to a microcontroller μC by a potential separator 17. Information regarding the current flow through the resistor 9 and the circuit breakers 8 is obtained from the known size of the shunt resistor in this manner.

There is also a test circuit 18 between the microcontroller μC and the timer 11, or reference voltage 10a, for detecting latent errors in the control, by carrying out a system test when starting up the system.

REFERENCE SYMBOLS

1 motor vehicle
2 circuit configuration

3 printed circuit board assembly
4 electric axle drive
5 link capacitor
6 inverter circuit
7 voltage surge protector
8 circuit breaker
9 resistor
10 comparator circuit
10a reference voltage
10b link voltage
11 timer
12 timer switch
13 high voltage diode
14 voltage pickup
15 voltage pickup
16 voltage pickup
17 potential separator
18 test circuit
DC+ direct current contact
DC− direct current contact
μC microcontroller

The invention claimed is:

1. A circuit comprising:
a link capacitor;
an inverter circuit; and
a voltage surge protector that is connected in parallel to the inverter circuit and to the link capacitor to protect the link capacitor from voltage overloads,
wherein the voltage surge protector comprises a timer that is configured to open a circuit breaker with a timer switch.

2. The circuit according to claim 1,
wherein the voltage surge protector comprises a circuit breaker and a resistor, wherein the voltage surge protector is configured to deflect a current through the resistor to reduce a voltage at the link capacitor.

3. The circuit according to claim 2, comprising:
a voltage pickup configured to determine a current flowing through the circuit breaker.

4. The circuit according to claim 2,
wherein the circuit breaker and the resistor are doubled for redundancy purposes.

5. The circuit according to claim 1,
wherein the voltage surge protector comprises a comparator circuit that is configured to:
compare a voltage at the link capacitor with a reference voltage; and
close the circuit breaker in response to the reference voltage being exceeded.

6. The circuit according to claim 5, comprising:
a voltage pickup configured to determine an output voltage from the comparator circuit.

7. The circuit according to claim 1, comprising:
a voltage pickup configured to determine a voltage at the timer switch.

8. The circuit according to claim 1,
wherein the circuit breaker and the timer switch are formed by transistors, and
wherein the timer switch is between a gate contact and a source contact on the circuit breaker.

9. The circuit according to claim 8, comprising:
a high voltage diode at the gate contact on the circuit breaker, which is configured to separate a high voltage at the gate contact on the circuit breaker from the rest of the voltage surge protector.

10. The circuit according to claim 1, comprising:

a voltage pickup configured to determine an output voltage from a comparator circuit.

11. The circuit according to claim 1, comprising:

a voltage pickup configured to determine a voltage at a timer switch.

12. The circuit according to claim 1, comprising:

a voltage pickup configured to determine a current flowing through a circuit breaker.

13. The circuit according to claim 1, comprising:

a test circuit configured to check the voltage surge protector for malfunctions.

14. The circuit according to claim 1, wherein the voltage surge protector is configured to drain the link capacitor.

15. A printed circuit board assembly comprising:

the circuit according to claim 1.

16. An electric axle drive for a motor vehicle comprising:

at least one electric maching; and the printed circuit board assembly according to claim 15.

17. A motor vehicle comprising:

the printed circuit board assembly according to claim 15.

18. A circuit comprising:

a link capacitor;

an inverter circuit; and a voltage surge protector that is connected in parallel to the inverter circuit and to link capacitor to protect the link capacitor from voltage overloads, wherein the voltage surge protector comprises a circuit breaker and a resistor, and wherein the circuit breaker and the resistor are doubled for redundancy purposes.

19. The circuit according to claim 18, wherein the voltage surge protector is configured to deflect a current through the resistor to reduce a voltage at the link capacitor.

20. The circuit according to claim 18, wherein the voltage surge protector comprises a comparator circuit that is configured to:

compare a voltage at the link capacitor with a reference voltage; and close the circuit breaker in response to the reference voltage being exceeded.

\* \* \* \* \*